United States Patent [19]

Whitley

[11] Patent Number: 4,463,310
[45] Date of Patent: Jul. 31, 1984

[54] APPARATUS FOR DETECTING THE PRESENCE OF COMPONENTS ON A PRINTED CIRCUIT BOARD

[75] Inventor: George J. Whitley, Philadelphia, Pa.

[73] Assignee: RCA Corporation, New York, N.Y.

[21] Appl. No.: 484,258

[22] Filed: Apr. 12, 1983

Related U.S. Application Data

[63] Continuation of Ser. No. 167,472, Jul. 11, 1980, abandoned.

[51] Int. Cl.³ .................... G01R 31/02; G01R 31/08; G01R 31/28
[52] U.S. Cl. ................................ 324/73 PC; 324/51; 324/158 P; 324/158 F
[58] Field of Search ........... 324/51, 66, 73 PC, 158 F, 324/158 P

[56] References Cited

U.S. PATENT DOCUMENTS

| | | | |
|---|---|---|---|
| 2,977,530 | 3/1961 | Cook | 324/51 |
| 3,676,776 | 7/1972 | Bauer et al. | 324/158 P X |
| 3,806,800 | 4/1974 | Bove et al. | 324/158 P X |
| 4,061,969 | 12/1977 | Dean | 324/73 PC |
| 4,264,202 | 4/1981 | Gugliotta et al. | 356/241 |
| 4,357,575 | 11/1982 | Uren et al. | 324/73 PC X |

FOREIGN PATENT DOCUMENTS 2038567  7/1980  United Kingdom ........... 324/158 F

OTHER PUBLICATIONS

Adsmond et al., *Pin Sensor for Parts Identification*, IBM Tech. Disclosure Bulletin, vol. 13, No. 9, Feb. 1971, p. 2619.

*Primary Examiner*—Gerard R. Strecker
*Attorney, Agent, or Firm*—Joseph S. Tripoli; George E. Haas; William Squire

[57] ABSTRACT

An array of reciprocating rods are aligned with circuit board lead apertures and are normally biased to engage the printed circuit board apertures. When leads are present the rods abut the leads. Circuit connectors attached to the rods close a circuit path when a missing lead is sensed. When one or more of the leads of a given component are missing, a circuit is closed and an indicator lights.

9 Claims, 4 Drawing Figures

APPARATUS FOR DETECTING THE PRESENCE OF COMPONENTS ON A PRINTED CIRCUIT BOARD

This a continuation of application Ser. No. 167,472, filed July 11, 1980, now abandoned.

The present invention relates to apparatus for detecting the presence of printed circuit board components.

Printed circuit boards may include many different kinds of components, such as resistors, transistors, capacitors, potentiometers, coils and others. During its manufacture, a printed circuit board is formed with apertures. The leads of the components are inserted through these apertures and then crimped. Subsequently, the printed circuit board is passed through a wave soldering machine for soldering the crimped leads to the appropriate conductors on the printed circuit board.

A problem sometimes encountered in the manufacturing process is that occasionally a component, whether inserted manually or by an automatic machine, may either inadvertently be omitted or may shake loose. The latter can occur during the travel of a board on conveyor systems which convey the assembly to different operating stations. During such travel, vibration may cause poorly crimped leads of a component to become free and the component to become separated from the circuit board. When a circuit board enters the wave soldering machine, apertures not having component leads therein become filled with solder and this makes it difficult to subsequently insert a component.

There are a number of known techniques which may be employed for detecting components on a printed circuit board. For example, in U.S. Pat. No. 3,499,204, discloses a system for positioning microcircuit chips on a substrate which includes means for automatically sensing the presence of a chip. However, the system is designed to sense only a particular component of a given size and shape. When the sensing head is lowered, pins on the machine are depressed by the respective semiconductor chips on the substrate. If a chip is missing, the pin intended to sense its presence will not be depressed, thereby providing a signal to so indicate. Such machines, however, are not universally adaptable for sensing the presence of all of the different kinds of components mentioned above. For example, a disc shaped capacitor standing somewhat on edge and supported solely by relatively flexible leads would be difficult to detect. The apparatus described above could deflect the component by bending the leads and its presence not sensed. Further, such components come in a wide variety of sizes and may be located at different heights above the printed circuit board and this adds to the difficulty of detecting them.

An apparatus embodying the present invention comprises means for sensing for the presence of the leads of a component in the apertures intended to receive these leads, and indicating means coupled to the sensing means. The latter, according to one aspect of the invention, provides an indication of the absence of the component when all of its leads are absent. According to another aspect of the invention, the absence of a lead may be indicated.

Figure 1:
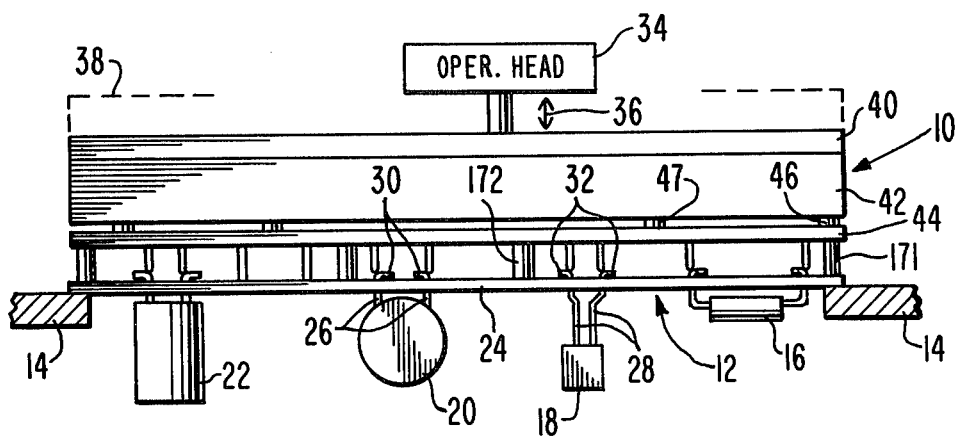
FIG. 1 is an elevation view of an apparatus embodying the present invention.

In FIG. 1, apparatus 10 embodying the present invention is located over the surface through which the crimped leads extend of a printed circuit board assembly 12. While for purpose of illustration, the board is shown beneath the apparatus 10, it can instead be above it so long as the crimped leads face 10. The assembly 12 is conveyed in a direction in and out of the drawing by the conveyor 14. Components on the assembly 12 include resistors and capacitors 16 of tubular shape, transistor devices 18, disc capacitors 20 and can type capacitors 22. Other components, not shown, may include potentiometers, chokes, coils and other elements. The leads 26 of capacitor 20, leads 28 of transistor 18, and so forth of the different components, pass through corresponding apertures in the board 24 and are crimped on the opposite side of the board 24. For example, leads 26 are crimped at 30 while the leads 28 are crimped at 32. The leads at this point are not yet soldered in place. The apparatus 10 is employed at a component sensing station on the conveyorized system in which the conveyor 14 is located. Apparatus 10 is connected to an operating head 34 which moves the apparatus 10 in the vertical directions 36.

In operation of the above, when the printed circuit board assembly 12 reaches the sensing station, sensors (not shown) such as microswitches, optical detectors and the like, detect the presence of the circuit board. The operating head 34 maintains the apparatus 10 in a raised position represented by the dashed lines 38. When the assembly 12 reaches the sensing station, the operating head is provided a signal for lowering the apparatus 10 to the position shown in solid line. The circuit board 24 includes a number of guide apertures (not shown) for receiving guidepins (not shown) attached to the apparatus 10 for accurately locating the array of components on the printed circuit board in alignment with the sensing elements in the apparatus 10. When the apparatus 10 is lowered to the position shown the guidepins attached thereto enter the guide apertures on the board 24 accurately aligning the board 24 to the apparatus 10.

Apparatus 10 checks for the presence and absence of the components secured to the board 24 by sensing the presence of the leads in the printed circuit board 24, such as leads 30 and 32. If the leads 30 and 32 are present, then the apparatus generates no signal. If one lead is missing from a component, the apparatus still generates no signal indicating the component is present. If all of the leads of a given component are missing, the apparatus at that time generates a signal indicating that that component is missing. In other words, the apparatus does not detect a missing lead from an aperture in this embodiment, but only whether or not the component is missing from the board. In the alternative, by slightly changing the configuration, as will be shown, individual missing leads can also be detected if desired.

Figure 2:
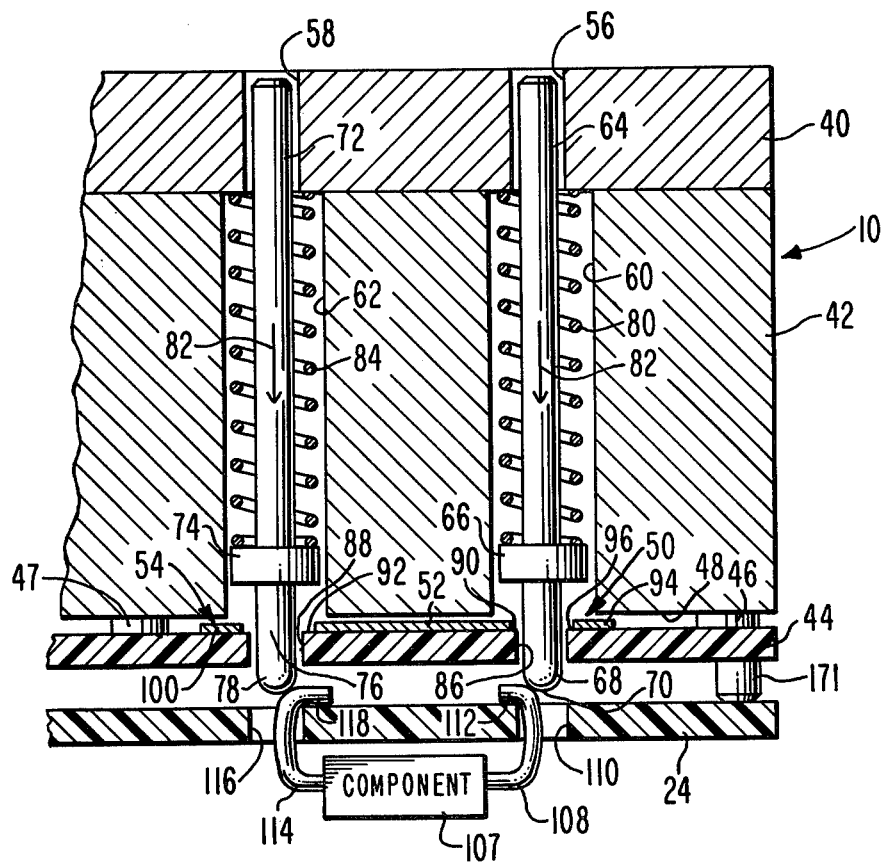
FIG. 2 is a sectional view of the apparatus of FIG. 1 illustrating elements detecting the presence of a component.
Figure 4:
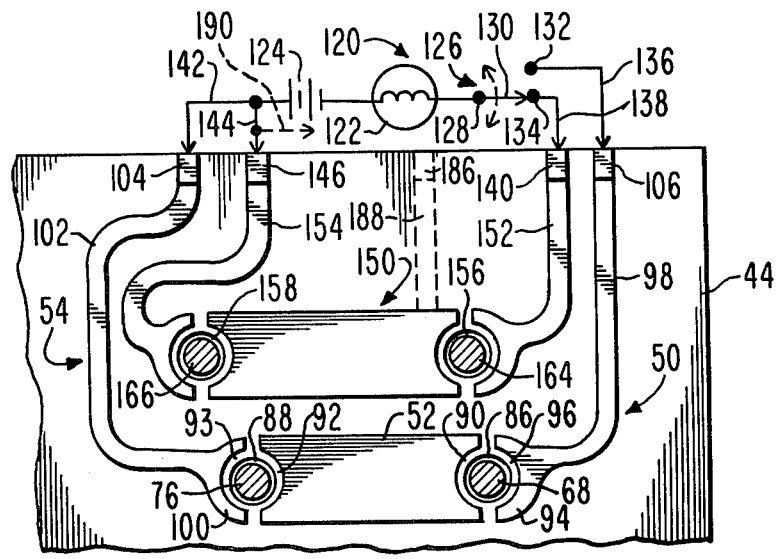
FIG. 4 is a plan view of a portion of the sensing circuit employed in the views of FIGS. 2 and 3.

FIGS. 2 and 4 illustrate, in greater detail, how the apparatus detects the presence of a component on the board 24. In FIG. 2 the apparatus 10 is illustrated in its lowered position as shown in FIG. 1 where it can sense the presence or absence of a component. Apparatus 10 includes an upper horizontal plate 40 and a support structure 42 secured to the upper plate 40. The upper plate 40 extends over the entire area of the circuit board 24. Support structure 42 is a relatively thicker plate which is secured to the underside of plate 40. The structure 42 may be made of any suitable material and preferably is lightweight and of low cost. Such materials may include aluminum or thermoplastics. Secured to the underside of support structure 42 is a printed circuit board 44 which is spaced from the structure 42 by spacers 46 and 47 and others. The circuit board 44 is mounted to the structure 42 by screws or other fasteners (not shown) and is spaced from the underside of structure 42 by the spacers 46, 47 so that the lower surface 48 of structure 42 is spaced from conductors 50, 52 and 54 on the board 44.

Plate 40 has an array of apertures such as apertures 56 and 58. This array of apertures is aligned exactly with the apertures 110 and 116, respectively, on printed circuit board 24 whose components are to be tested. Somewhat larger bore 60 in support structure 42 is concentric with the bore 56 and a similar bore 62 is concentric with the bore 58. The complete array of bores such as bores 60 and 62 in support structure 42 are similarly aligned and concentric with the bores in plate 40.

Mounted within bores 56 and 60 is a sensing rod 64 which has attached thereto an annular flange 66. Depending from the flange 66 is a sensing rod element 68 with a smooth rounded tip 70. Mounted in bores 58 and 62 is a similarly constructed rod 72 which has an annular flange 74 attached thereto. Rod element 76 depends from the flange 74 and has a rounded tip 78. Secured in all of the bores in plate 40 and support structure 42 are similar rod structures. Within bore 60 is a spring 80 which resiliently urges rod 64 in the direction 82 toward board 44. Spring 84 resiliently urges rod 72 in the same direction. A suitable retainer (not shown) captivates the rods 64 and 72 to structure 42 within the respective bores 60 and 62.

In FIG. 4 a plan view of the board 44 is shown which includes the conductor 52 which extends between apertures 86 and 88 in board 44. Conductor 52 partially circumscribes aperture 86 and is spaced therefrom by gap 90. Similarly, the conductor 52 is spaced from aperture 88 by gap 92 and partially circumscribes aperture 88. Spaced from conductor 52 is a semi-circular pad 94 which partially circumscribes aperture 86 and is spaced therefrom by gap 96. Pad 94 is connected to a conductor 98. Pad 100 partially circumscribes aperture 88 and is spaced from conductor 52 and aperture 88 by gap 93. Conductor 102 is connected to pad 100. Conductor 102 has a terminal 104 and conductor 98 has a terminal 106.

The rod element 68 is within aperture 86 and rod element 76 is within aperture 88. The flanges 66 and 74 are larger than the diameter of the gaps 90, 96 around aperture 86 and gaps 92 and 93 around aperture 88, respectively. Thus, the flanges 66 and 74, if permitted to do so, will make contact with the conductor 52 and pads 94 and 100 on board 44. For example, flange 66 unless otherwise permitted when in its lowermost position will make contact with pad 94 and conductor 52 surrounding aperture 86 to provide a switch connection between conductor 98 and conductor 52. Similarly, flange 74, if permitted to do so, when in its lowermost position, makes electrical contact with conductor 52 and pad 100 to provide an electrical circuit path between conductor 52 and terminal 104.

Circuit board 24 when conveyed by conveyor 14, FIG. 1, to the test station will be positioned as shown in FIG. 2. When in this position, component 107 will be positioned as shown. Component 107 has a lead 108 which passes through aperture 110 of board 24 and crimped over at 112 on the other side of the board 24. The component 107 has a second lead 114 which passes through aperture 116 in board 24 and crimped over at 118. The apertures 110 and 116 are in axial alignment with rods 64 and 72, respectively. This also automatically aligns the rod elements 68 and 76 with apertures 110 and 116, respectively. The elements 68 and 76 are made slightly smaller in diameter than the apertures 110 and 116 in board 24 so as to easily pass into these apertures. However, with the presence of leads 108 and 114 in apertures 110 and 116, the effective size of the apertures are now reduced sufficiently to impede the passage of elements 68 and 78 therein. As a result, the elements 68 and 76 contact the crimped leads 112 and 118 and are prevented from lowering into the apertures 110 and 116. This action keeps the flanges 66 and 74 above the conductors 50, 52 and 54 and prevents them from making electrical contact with these conductors. In effect, the flanges 66 and 74 act as switch elements which remain in the open switch condition.

In FIG. 4 a sensing device 120 includes a light 122, a battery 124 and a switch 126 serially connected together with the light 122 being connected to terminal 128 of switch 126. Wiper 130 of switch 126 makes contact with terminals 132 and 134 of switch 126. Conductor 136 connects terminal 132 to terminal 106 and conductor 138 connects terminal 134 to terminal 140. Conductor 142 connects terminal 104 to battery 124 and conductor 144 connects terminal 146 to battery 124.

With the wiper 130 connected to terminal 132, when the flanges 66 and 74 of FIG. 2 make contact with conductors 50, 52 and 54, a circuit is completed and light 122 will illuminate. However, when the leads of component 107 are in the apertures 116 and 110, the effective size or diameters of the apertures is reduced, the flanges 66 and 74 do not make contact with the conductors 50, 52 and 54, the circuit remains open and the light 122 is off.

Mounted on board 44, FIG. 4, is a second set of conductors 150, 152 and 154. These conductors are mounted adjacent apertures 156 and 158 in a manner similar to that described above with respect to conductors 50, 52 and 54 and apertures 86 and 88. Conductor 154 is connected to terminal 146 and conductor 152 is connected to terminal 140. When the wiper 130 of switch 126 is connected as shown in FIG. 4, conductors 152 and 154 are connected in circuit with the battery 124 and light 122. Should this set of conductors form a completed circuit with conductor 150 the light 122 will illuminate.

Figure 3:
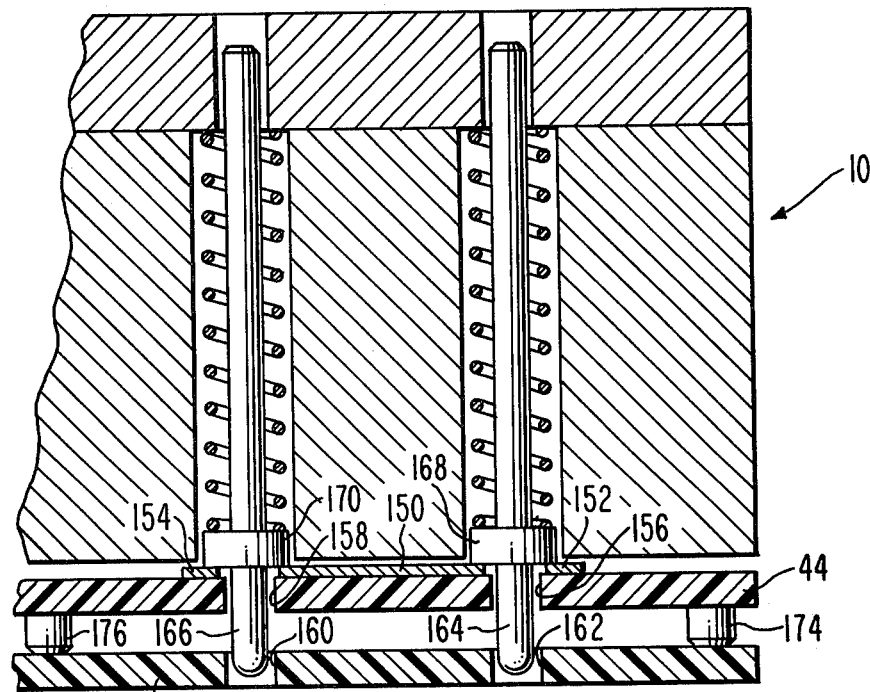
FIG. 3 is a section elevation view similar to that of FIG. 2 illustrating the elements of the apparatus of FIG. 1 sensing a missing component.

FIG. 3 illustrates such an arrangement. In FIG. 3 board 24 is shown with no component leads mounted in apertures 160 and 162. Rod elements 164 and 166 therefore are in the respective apertures 162 and 160. This causes the flanges 168 and 170 to close the circuit comprising conductors 152, 150 and 154 thereby illuminating light 122 when the wiper is connected as shown in FIG. 4.

A similar set of conductors, such as conductors 152, 150 and 154, is provided for each and every component on a printed circuit board to be inspected. Corresponding to each set of conductors is a set of rods and rod elements such as that illustrated in FIGS. 2 and 3 for providing a closed circuit condition for that set of conductors.

Thus, when the wiper 130 of switch 126, FIG. 4, is positioned to connect each set of conductors in circuit with the light 122, illumination of the light 122 for a given position of the wiper 130 provides an operator with an indication that a particular component is missing. It should be understood that while a manual wiper 130 is illustrated, this could be an electronic switch coupled to an array of lights 122 mounted on a display board. Also, the system could be connected to a computer which provides an output display indicating which components are missing. No signal is generated unless a component is missing, therefore, the presence of a signal provides such indication. Further, because the rod elements of the sensor rods only contact the crimped leads of the components, the configuration of the particular components is not considered. The configuration of the crimped leads is somewhat similar for all components regardless of the component shape and configuration. Therefore, a reliable component detection system is provided.

To prevent damage to the circuit board 24, it is preferred that the apparatus 10 be spaced from the circuit board 24 when operating. This is accomplished by spacers 171 and 172 in FIG. 1 and spacers 174 and 176 in FIG. 3. Spacers 171, 172, 174 and 176 are mounted to the underside of circuit board 44. These spacers may comprise rubber bumpers or plastic elements.

In the alternative, if it is desired to sense a missing lead rather than a missing component, then the circuit arrangement of FIG. 4 can be so modified. This can easily be done by connecting, for example, an additional conductor such as 188 (dashed) and terminal 186, for each of conductors 150 and 52 parallel to conductors 152 and 154. A switch can be provided to connect light 122 across each aperture. For example, lead 144 can be made into a moveable contact which moves in direction 190 into ohmic contact with the various terminals such as terminal 186. This places light 122 across aperture 156. This can be done for each and every aperture on board 44.

What is claimed is:

1. Apparatus for detecting the possible absence of any one of a plurality of components of a printed circuit board, the components, when present, each having at least one lead passing through a corresponding aperture in the board, said apparatus comprising:
    a support structure;
    means for aligning said board and said corresponding aperture relative to said support structure;
    means secured to the support structure aligned with said at least one lead of each component by said means for aligning for sensing the presence and absence of any of said at least one aligned lead corresponding to said aligned aperture; and
    indicating means coupled to said means for sensing for providing an indication of the absence of one or more of said components.

2. The apparatus of claim 1 wherein said means for sensing comprises
    first and second conductors normally not in electrical contact with one another fixed to a supporting element; and plunger means alignable with said aperture having an end portion dimensioned to pass into said aperture when no lead is present in said aperture but which is too large to pass into said aperture when a lead is in place in the aperture, said plunger means including a third conductor which in the retracted position of the plunger means does not engage the first and second conductors and in a second position of the plunger means in which its said end portion passes into said aperture, electrically connects said first and second conductors.

3. The apparatus of claim 2 wherein said plunger means end portion is normally biased to pass into said aperture.

4. The apparatus of claim 2 including an array of said plunger means comprising a plurality of sets, each set corresponding to a separate, different component, and a plurality of corresponding sets of said first and second circuit conductors, each set of conductors being placed in the electrically connected state by a corresponding set of plunger means.

5. The apparatus of claim 1 wherein said means for sensing includes support means, plunger means secured to said support means, means biasing the plunger means in a given direction, said plunger means comprising a plunger rod corresponding to said lead secured for reciprocating in said given direction and conductor means coupled to said rod for operating said indicator means when said rod engages said aperture in the absence of said component lead in said engaged aperture.

6. In an apparatus for simultaneously detecting the presence of a plurality of components in a printed circuit board of the type having a plurality of sets of apertures, each set for receiving the leads of a different component comprising:
    support means;
    means for aligning said board relative to said support means;
    a plurality of sensor means secured to said support means for moving in a given direction in alignment with said leads adjacent said apertures when said board is aligned, said sensor means including elements positioned to engage corresponding ones of said aligned leads of said plurality of components;
    circuit board means having a plurality of sets of conductors each of which sets forms a circuit path to first and second terminals, said circuit path being discontinuous adjacent each aperture of a set; and
    a plurality of conductor contacts, each contact being secured to a different element and positioned to engage one of said conductors to close the circuit path adjacent the aperture corresponding to that element in the absence of said corresponding aligned leads.

7. The apparatus of claim 6 further including indicating means coupled to said terminals for indicating the closed circuit path state of said conductors.

8. The apparatus of claim 6 including spring means normally biasing said elements into engagement with said apertures.

9. The apparatus of claim 6 wherein said circuit board means includes a plurality of apertures in alignment with said printed circuit board set of apertures and in engagement with said elements during both the closed and opened states of said circuit path.

* * * * *